United States Patent [19]

Thomas et al.

[11] Patent Number: 5,798,148
[45] Date of Patent: Aug. 25, 1998

[54] POROUS METAL COMPOSITE BODY

[75] Inventors: Thomas Ronald Thomas, Rowan House; Jas Pal Singh Badyal, Shincliffe, both of England

[73] Assignee: British Technology Group Limited, London, England

[21] Appl. No.: 700,367
[22] PCT Filed: Mar. 21, 1995
[86] PCT No.: PCT/GB95/00620
  § 371 Date: Aug. 26, 1996
  § 102(e) Date: Aug. 26, 1996
[87] PCT Pub. No.: WO95/25588
  PCT Pub. Date: Sep. 28, 1995

[30] Foreign Application Priority Data

Mar. 21, 1994 [GB] United Kingdom ............... 9405518

[51] Int. Cl.⁶ ............................................. B01J 23/40
[52] U.S. Cl. ..................... 427/535; 427/250; 427/536; 428/408; 502/325; 502/326; 502/337; 502/339
[58] Field of Search .......................... 502/325, 326, 502/337, 339, 101; 428/408; 156/643; 427/536, 250, 535

[56] References Cited

U.S. PATENT DOCUMENTS

| 1,865,180 | 6/1932 | Faragher . | |
|---|---|---|---|
| 3,715,238 | 2/1973 | Mayell . | |
| 4,540,476 | 9/1985 | Dyer . | |
| 4,689,111 | 8/1987 | Chan et al. | 156/643 |
| 4,756,964 | 7/1988 | Kincaid et al. | 428/408 |
| 4,933,060 | 6/1990 | Prohaska et al. | 204/192.36 |
| 5,527,566 | 6/1996 | Schadt et al. | 427/536 |

FOREIGN PATENT DOCUMENTS

| 0 247 771 | 12/1987 | European Pat. Off. . |
| 0 306 944 | 3/1989 | European Pat. Off. . |
| 1 556 452 | 11/1979 | United Kingdom . |

OTHER PUBLICATIONS

Patent Abstract of Japan, vol. 005 No. 152 (C073), 25 Sep. 1981 & JP, A 56 084636 (Tanaka Kikinzoku Kogyo KK) 10 Jul. 1981.

Patent Abstract of Japan, vol. 010 No. 65 (E–388), 14 Mar. 1986 & JP, A, 60 216458 (Matsushita Denki Sangyo KK) 29 Oct. 1985.

*Primary Examiner*—Wayne Langel
*Assistant Examiner*—Tanaga Anne Boozer
*Attorney, Agent, or Firm*—Nixon & Vanderhye

[57] ABSTRACT

Microporous polytetrafluoroethylene is metallised with 1 micron platinum, which is plasma-oxygenated then plasma-hydrogenated, whereby to increase the surface area of the platinum. The resulting composite body has applications as a catalyst or electrode.

10 Claims, No Drawings

POROUS METAL COMPOSITE BODY

This application claims benefit of international application PCT/GB95/00620 filed Mar. 21, 1995.

This invention relates to the production of a composite body comprising porous metal attached to a substrate.

There are applications for such composite bodies in the electrochemical field such as for gas sensors and fuel cells, as well as in the general field of catalysis of chemical reactions and catalytically acting surfaces generally, where high surface areas are required. The substrate is therefore preferably of high surface area, for example it is porous (preferably microporous), and is advantageously of an inert material such as a polymeric material such as a fluoropolymer. Microporous fluoropolymers are well known as chemically, thermally and biologically stable materials used in various phase separation situations, and are advantageously made, for the purposes of the invention, of microporous PTFE (polytetrafluoroethylene) membrane products as disclosed in European Patent 247771, which are useful in a range of applications, including metallised examples produced by for example sputter coating, electrolysis or spin coating. (In spin coating, typically, colloidal catalyst particles are impacted upon a PTFE membrane substrate by the hydrodynamic/centrifugal action of a spinning rotor immersed in the colloid.)

Although many porous Gp VIII metal composite bodies are possible according to the invention, certain materials are of especial interest to workers in the fuel cell, gas sensor and air battery fields, for example the platinum group metals including platinum, palladium and nickel.

In the electrochemical field, it is known that interlocking structures of catalyst and PTFE can be made by simple admixture of dispersions of the materials (e.g. GB Patent 1556452), but the proportion of expensive catalyst to lower-cost PTFE is very high, e.g. 10:3 by mass.

This invention seeks to increase the metal surface area of a given composite body, for example to improve the catalytic activity per unit volume of the composite body or per unit mass of catalyst metal.

U.S. Pat. No. 3715238 teaches the depolarisation of a fuel cell catalyst (e.g. Ru+Pt+some PTFE) by voltage-sweep-treating it in a selected electrolyte at 1 cycle per ½20 minutes, whereby, gradually, catalytic metal is deposited at new surfaces so the catalytic metal surface area is gradually increasing. This is too slow as a production method, not to mention the need to rinse and dry or otherwise remove all traces of electrolyte, for some catalytic purposes. Again, the proportion of expensive metal to lower-cost PTFE is very high, nearly $10^4$:1.

U.S. Pat. No. 4540476 teaches the production of a nickel electrode from a porous nickel plaque by applying an alternating potential, such that the nickel dissolves on the oxidising part of the cycle and, on the reducing part of the cycle, oxidised nickel is precipitated as hydroxide. This is performed on nickel sintered on a wire mesh support, thus foregoing the economy, porosity and high surface area per unit volume which binding as a composite with PTFE would have allowed, and also suffers from the above-noted disadvantages of a wet electrolytic process.

According to the present invention, therefore, a porous Gp VIII metal composite body is made by metallising a porous (e.g. ceramic or polymeric) substrate, preferably in the gas phase, (the ratio metal:substrate being preferably less than 1:1, preferably less than 100:1, optionally $<10^4$:1), oxidising the metallisation and optionally or partly or wholly reducing the metallisation, characterised in that the oxidation is performed in the gas phase by oxidative plasma and the reduction is performed in the gas phase by reducing (e.g. ammonia, hydrazine or hydrogen) plasma. The oxidative plasma may be oxygen or other anion (uni- or multi-atomic e.g. bromine) which forms a volatile product with hydrogen. In either case, the gas in question may be present at a pressure of from 0.05 to 1 Torr. Plasma treatment may be performed at a power of from 1 to 30 (preferably 2 to 5) Watts/dm$^2$ of substrate, and may continue for from 1 to 20 e.g. 3 to 10 minutes.

The substrate is therefore preferably of an inert material such as a ceramic or polymeric material such as a fluoropolymer such as PTFE or other material at least as stable towards plasma exposure, and may be microporous, with pore sizes of for example up to about 10 microns.

The Gp VIII metal (by which we include alloys) may be a platinum group metal, e.g. platinum, palladium or nickel, or may for example be ruthenium or rhodium or silver.

The invention extends to the composite body so made and to its use as a catalyst, for example in a gas sensor, fuel cell, or electrode. The invention allows the manufacture of a (hitherto unknown) porous metal composite body comprising a porous substrate bearing less than 1% by weight metal, the metal having a surface area at least ten times that of the substrate. The metal may be under 1 micron thick, e.g. 0.05 to 0.1 microns or less, giving maximum catalytic activity at minimum materials cost.

The elements of inconvenience and lack of reproducibility of 'wet' methods such as electrolysis described earlier can be avoided by carrying out the metallisation, the oxidation and the reduction in the gas phase. Gas phase techniques are generally cleaner and quicker and allow greater control over product parameters.

Gas-phase metallisation may be carried out the same way as in the preparation of samples for electron microscopy where the metallic layer conducts away impinging electrons during analysis thus prolonging the life of non-conducting specimens. Additionally the technique allows the production of certain decorative and protective coatings particularly of expensive materials in a cost-effective way.

Good control can be exercised over metal purity and thickness (a major consideration in terms of cost) and hence over the metal loading of the resulting product, e.g. electrode.

Preferably, the next stage of the process of making a composite body according to the invention utilises a cold plasma—so called because the process temperature at the substrate is about 300K, and can be kept below 325K. The composite, let us suppose platinum on microporous PTFE, may be placed in an evacuated chamber and subjected to an oxygen plasma. A controlled amount of the platinum may be oxidised depending upon the ultimate electrical conductance required of the composite. At an appropriate stage the oxidation may be stopped and the oxidised composite subjected to a hydrogen plasma. Under these reducing conditions the oxide reverts to the metal and porosity is induced in the metallisation layer as interstices are created at points previously occupied by oxide oxygen, the latter being removed by evacuation as water molecules.

This process could clearly be applied to other geometries as well as other metals and substrates. In general the most efficient use of the catalytic entity both in terms of cost and energetics can be made when the surface area is maximised. The disposition and amount of catalyst can be very closely controlled according to ultimate process requirements, for example electrodes for gas sensors, chromatographic separations on treated granules or planar separations with films or tubes.

The invention will now be described by way of example.

EXAMPLE 1

A cylindrical glass glow discharge reactor, 4.5 cm diameter and ½ litre capacity, enclosed in a Faraday cage, is fitted with a gas inlet, a Pirani pressure gauge and a rotary pump attached to a liquid nitrogen cold trap. The reactor is cleaned with detergent, rinsed with isopropyl alcohol and oven dried, followed by a high power (50 W) air plasma treatment for 30–40 minutes. A matching network is used to inductively couple a copper coil (4 mm diameter, 9 turns spanning 8 to 15 cm from the gas inlet) wound externally around the reactor to a 13.56 MHz radio frequency source, to generate this plasma. A sample of microporous PTFE is loaded into the reactor, within the region inside the coil. This sample is a sheet of size 100 mm×150 mm coated by sputtering to a thickness of 1 micron with high purity platinum. The reactor is evacuated to a low pressure, typically $5\times10^{-3}$ Torr, and oxygen of 99.9% purity is introduced at a pressure of 0.05 or 0.1 to 1 Torr, typically 0.1, 0.2 or 0.5 Torr, purged for about 5 minutes. The plasma is then ignited at 30 watts for typically 10 minutes. The radio frequency is then switched off, the gas inlet closed and the reactor evacuated back to base pressure for at least 5 minutes. This introduces oxygen atoms into the platinum.

The second stage, a reduction step, is carried out similarly by introducing high purity (99.9%) hydrogen at about 0.05 or 0.1 to 1 Torr, e.g. 0, 1, 0.2 or 0.5 Torr, purging for a few minutes, and the plasma ignited at 30 watts for typically 10 minutes. This causes hydrogen to react with the oxygen atoms. The radio frequency is then switched off, the gas inlet closed and the reactor evacuated for 5 minutes. This causes the reacted oxygen to evaporate as water vapour, leaving behind a platinum surface "roughened" by physical removal of the oxygen from sites where it had reacted and had displaced platinum atoms, hence increasing its surface area. The system is then brought back to atmospheric pressure and the specimen is removed for use.

Further examples of the invention were made using the foregoing apparatus but varying the conditions as follows:

EXAMPLE 2

Platinum was deposited to various thicknesses, namely 5 µm, 1 µm, 0.1 µm, and to lesser thicknesses, to which it is meaningless to ascribe an exact dimension but which were established to lie in the range 0.05–0.1 µm. After oxidation and reduction as above, all yielded successful catalysts.

EXAMPLE 2A

Example 2 was repeated but with the samples located not within the region inside the coil but in the "afterglow" region just outside. This removed the samples from the influence of the highest-energy charged particles and hence lessened ablation of deposited metal by over-energetic impacts from those particles. The remaining charged particles were found to be of an energy distribution which was highly apt for oxidation and reduction. The samples made successful catalysts.

EXAMPLE 3

Instead of just platinum, sputtering of a standard 60:40 gold/palladium alloy was carried out. It was deposited on the PTFE, broadly unchanged in composition, to a thickness of 1 µm. After oxidation and reduction as above, all samples yielded successful catalysts. It is believed that under these conditions the palladium in the deposited alloy has had its surface area increased, leaving the gold unchanged and still a good electrical conductor.

EXAMPLE 4

The sputtered substrate of Example 3 was oxidised under 0.2 Torr oxygen and reduced under 0.1 Torr hydrogen. This was exceptionally successful.

EXAMPLE 5

Examples 3 and 4 were successfully repeated using gold-and-palladium, and (separately) using copper.

EXAMPLE 6

Examples 3 and 4 were successfully repeated using silver. Oxidation was successful with 0.2 Torr oxygen and only 3 Watts plasma (for 3 minutes).

EXAMPLE 7

Example 2 was repeated with oxidation and reduction both under 0.1 Torr of the respective gas, both under a mild plasma (5 Watts) for 5 minutes. This mild treatment yielded an extremely effective electrochemical material for e.g. amperometric sensor use.

We claim:

1. A method of making a porous Gp VIII metal composite body, comprising:
    metallising a porous substrate with a Group VIII metal,
    oxidising the metallized porous substrate in the gas phase by oxidative plasma, and then
    reducing the metallized porous substrate in the gas phase by reducing plasma.

2. A method according to claim 1, wherein the substrate is ceramic or polymeric.

3. A method according to claim 2, wherein the substrate is a fluoropolymer.

4. A method according to claim 1, wherein the body is metallised in the gas phase.

5. A method according to claim 1, wherein the Gp VIII metal is platinum, palladium or nickel.

6. A method according to claim 1, wherein the ratio metal:substrate is less than 1:1.

7. A method according to claim 6, wherein the ratio metal:substrate is less than 1:100.

8. A method according to claim 1, in which the metallized porous substrate is oxidised by oxygen plasma.

9. A method according to claim 1, wherein the reduction is performed by hydrogen plasma.

10. A method according to claim 1 in which the substrate does not exceed 325K during the plasma treatments.

* * * * *